US012738926B2

(12) United States Patent
Doi et al.

(10) Patent No.: US 12,738,926 B2
(45) Date of Patent: Sep. 15, 2026

(54) ELECTRONIC CONTROL UNIT AND GATE DRIVING METHOD OF POWER SEMICONDUCTOR ELEMENT

(71) Applicant: Hitachi Astemo, Ltd., Hitachinaka (JP)

(72) Inventors: Masahiro Doi, Hitachinaka (JP); Takeshi Ikuyama, Hitachinaka (JP); Takuya Iinuma, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 5 days.

(21) Appl. No.: 18/868,116

(22) PCT Filed: May 27, 2022

(86) PCT No.: PCT/JP2022/021730
§ 371 (c)(1),
(2) Date: Nov. 21, 2024

(87) PCT Pub. No.: WO2023/228402
PCT Pub. Date: Nov. 30, 2023

(65) Prior Publication Data

US 2025/0330153 A1 Oct. 23, 2025

(51) Int. Cl.
*H03K 17/687* (2006.01)
*H03K 3/012* (2006.01)

(52) U.S. Cl.
CPC ........... *H03K 3/012* (2013.01); *H03K 17/687* (2013.01)

(58) Field of Classification Search
CPC ................................................. H03K 17/687
USPC ................................................ 327/108–112
See application file for complete search history.

(56) References Cited

U.S. PATENT DOCUMENTS

| | | | |
|---|---|---|---|
| 5,926,012 | A | 7/1999 | Takizawa et al. |
| 2018/0062643 | A1 | 3/2018 | Trescases et al. |
| 2021/0258004 | A1 | 8/2021 | Akiyama et al. |

FOREIGN PATENT DOCUMENTS

| | | | |
|---|---|---|---|
| JP | H06291631 | A * | 10/1994 |
| JP | 2016-174455 | A1 | 9/2016 |
| JP | 2020-061903 | A | 4/2020 |

OTHER PUBLICATIONS

International Search Report Issued in PCT Application No. PCT/JP2022/021730 dated Aug. 2, 2022, with English Translation.
Extended European Search Report issued in EP Application No. 22943802.3 dated Feb. 10, 2026 (9 Pages).

* cited by examiner

*Primary Examiner* — Tomi Skibinski
(74) *Attorney, Agent, or Firm* — Foley & Lardner LLP

(57) ABSTRACT

In an electronic control unit on which a power semiconductor element is mounted, provided is a highly reliable and low-loss electronic control unit capable of performing a high-speed switching operation while suppressing a surge voltage during a switching operation of the power semiconductor element. The electronic control unit includes: a microcontroller; a power semiconductor element; and a gate drive circuit that generates a gate drive current of the power semiconductor element on a basis of a command from the microcontroller. The gate drive circuit detects a change in an output voltage of the power semiconductor element to detect start of on/off operation of switching, increases a gate drive current in a process of the switching in an on state and before reaching a peak voltage, and decreases the gate drive current in a process of the switching in an off state and before reaching the peak voltage.

2 Claims, 7 Drawing Sheets

ELECTRONIC CONTROL UNIT AND GATE DRIVING METHOD OF POWER SEMICONDUCTOR ELEMENT

TECHNICAL FIELD

The present invention relates to a configuration of an electronic control unit and control thereof, and more particularly to a gate drive circuit and a gate driving method of a power semiconductor element mounted on the electronic control unit.

BACKGROUND ART

With the advance of electronic control technology, improvement of the performance of an automobile by electronic control has been achieved in various functions and devices including an engine. In a current automobile, 100 or more electronic control units (ECU) are mounted in many cases, and are important components that control various advanced technologies. These ECUs are required to be small in size and weight, low in cost, and high in efficiency.

In a broad sense ECU including an ECU, an engine control unit, and an inverter utilized in advanced driver-assistance systems (ADAS), an input processing circuit that processes inputs of sensors and switches, an AD conversion circuit, a microcontroller, a power supply circuit, an output processing circuit, a power semiconductor element, and the like are generally mounted.

For example, in the inverter, a direct current is converted into an alternating current by switching control of a power semiconductor element such as an insulated gate bipolar transistor (IGBT) or a Sic-power metal-oxide-semiconductor field-effect transistor (MOSFET). In order to improve the conversion efficiency of the inverter, it is effective to reduce the switching loss of the power semiconductor element, but since there is a trade-off relationship between the switching loss of the power semiconductor element and the surge voltage at the time of switching, a gate drive circuit and a gate driving method of a highly efficient power semiconductor element having small switching loss have been studied.

As the background art of the present technical field, for example, there is a technology such as PTL 1. PTL 1 discloses "a drive circuit that, during a main discharge period, monotonously increases and sets a command discharge current of a gate of a switching element and switches a switching element to an off state by controlling a gate discharge current to a preset command discharge current, and, during a main charge period, monotonously decreases and sets a command charge current of the gate of the switching element and switches the switching element to an on state by controlling a gate charge current to the preset command charge current". (Abstract of PTL 1 or the like)

CITATION LIST

Patent Literature

PTL 1: JP 2016-174455 A

SUMMARY OF INVENTION

Technical Problem

The drive circuit described in PTL 1 is characterized in that the drive circuit is driven by monotonically increasing the discharge current during the main discharge period, and monotonically decreasing the charge current during the main charge period. This gate drive system is a feedforward type, and is driven at a constant gate current value, which is recorded in a memory in advance, for monotonic increase or monotonic decrease and at a constant time of start or stop for increase or decrease.

However, in the feedforward type of constant fixed driving, it is not optimal driving for characteristic variations of temperature dependency, threshold voltage or the like of the power semiconductor element to be driven, and thus there is room for improvement of switching characteristics of the power semiconductor element.

In this regard, an object of the present invention is to provide a highly reliable and low-loss electronic control unit capable of performing a high-speed switching operation while suppressing a surge voltage during a switching operation of a power semiconductor element in an electronic control unit on which the power semiconductor element is mounted, and a gate driving method of the power semiconductor element.

Solution to Problem

In order to solve the above problems, the present invention includes: a microcontroller; a power semiconductor element; and a gate drive circuit that generates a gate drive current of the power semiconductor element on the basis of a command from the microcontroller. The gate drive circuit detects a change in an output voltage of the power semiconductor element to detect start of on/off operation of switching, increases a gate drive current in a process of the switching in an on state and before reaching a peak voltage, and decreases the gate drive current in a process of the switching in an off state and before reaching the peak voltage.

In addition, the present invention is a gate driving method of a power semiconductor element including: (a) a step of detecting a change in a voltage between a drain terminal and a source terminal of a power semiconductor element to detect start of an on/off operation of switching; (b) a step of increasing a gate drive current in a process of the switching when the power semiconductor element is in an on state and before reaching a peak voltage; and (c) a step of reducing the gate drive current in a process of the switching when the power semiconductor element is in an off state and before reaching the peak voltage.

Advantageous Effects of Invention

According to the present invention, in the electronic control unit on which the power semiconductor element is mounted, it is possible to realize the highly reliable and low-loss electronic control unit capable of performing a high-speed switching operation while suppressing a surge voltage during a switching operation of the power semiconductor element, and a gate driving method of the power semiconductor element.

Problems, configurations, and effects other than those described above will be clarified by the following description of embodiments.

DESCRIPTION OF EMBODIMENTS

Figure 1:
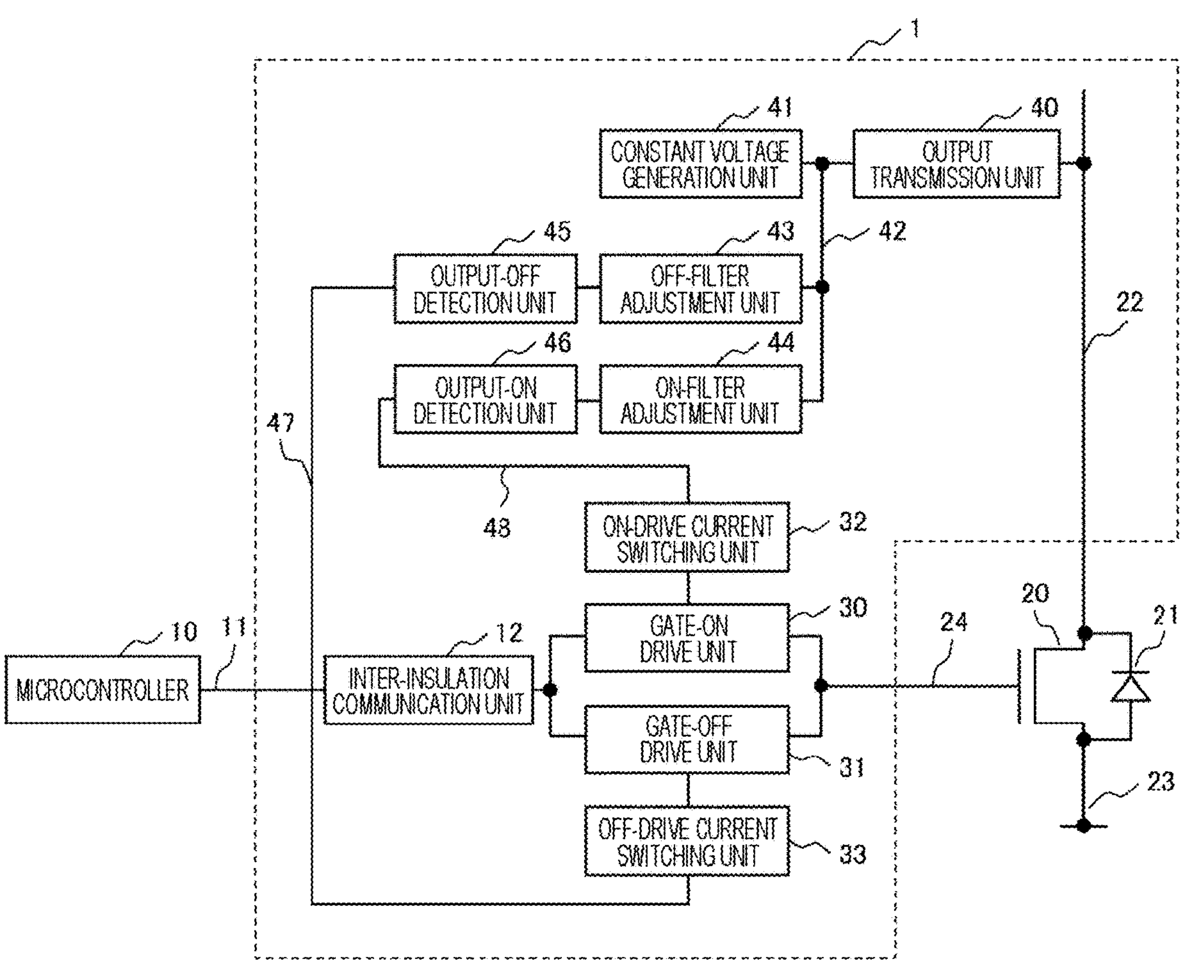
FIG. 1 is a diagram illustrating a schematic configuration of a gate drive circuit according to a first embodiment of the present invention.

Hereinafter, embodiments of the present invention will be described with reference to the drawings. Note that in the drawings, the same components are denoted by the same reference numerals, and the detailed description of overlapping components is omitted.

In addition, in each embodiment, the names of the terminals of the power semiconductor element are unified to a gate terminal, a drain terminal, and a source terminal, but in the case of the IGBT, the drain terminal can be read as a collector terminal, and the source terminal can be read as an emitter terminal. In addition, although an IGBT or a SiC-power MOSFET is assumed as the power semiconductor element, it is possible to target all power devices that control switching between on and off by a gate voltage, and a Si-power MOSFET, a GaN-power MOSFET, or the like may be used.

First Embodiment

An electronic control unit and a gate driving method of a power semiconductor element according to a first embodiment of the present invention will be described with reference to FIGS. 1, 4, and 5.

FIG. 1 is a schematic configuration diagram of the electronic control unit of the present embodiment, and mainly illustrates a configuration of a gate drive circuit 1. FIGS. 4 and 5 are timing charts at the time of an off operation and at the time of an on operation of the power semiconductor element 20, respectively.

As illustrated in FIG. 1, the electronic control unit of the present embodiment includes, as main components, a microcontroller 10, a power semiconductor element 20, and the gate drive circuit 1. In addition, an input processing circuit, an AD conversion circuit, a power supply circuit, an output processing circuit, and the like are provided, but are omitted in FIG. 1.

Note that FIG. 1 illustrates a configuration diagram for one arm for driving the power semiconductor element 20. In general, in an inverter or the like, motor driving is performed by using three phases of upper and lower arms in which the configurations of one arm are connected vertically, and this case is configured by a gate drive circuit of six arms having the same configuration as in FIG. 1 and one microcontroller. Even in the case of being driven by a plurality of arms, the operation is the same as the operation of the single-phase arm, and thus, here, the embodiment of the present invention will be described as the operation of one arm.

The microcontroller 10 outputs a PWM gate drive signal 11 to the gate drive circuit 1.

The gate drive circuit 1 includes an on-drive current switching unit 32 and an off-drive current switching unit 33 that switch a gate drive current of the power semiconductor element 20, a gate-on drive unit 30 and a gate-off drive unit 31 that drive the power semiconductor element 20 with a set drive current, an output transmission unit 40 connected to a drain terminal 22 of the power semiconductor element 20, a constant voltage generation unit 41 that generates a constant voltage for output detection, an off-filter adjustment unit 43 and an on-filter adjustment unit 44 that filter the voltage of the output detection terminal 42, an output-off detection unit 45 and an output-on detection unit 46 that detect the off-start and the on-start of the power semiconductor element 20, respectively, on the basis of a signal after inter-insulation filtering, and an communication unit 12.

The off operation of the power semiconductor element 20 by the gate drive circuit 1 of the present embodiment will be described with reference to FIGS. 1 and 4.

When off-drive is instructed by the PWM gate drive signal 11 from the microcontroller 10, a signal is transmitted by the inter-insulation communication unit 12 from a low-voltage unit (not illustrated) in which the microcontroller 10 is mounted to a high-voltage unit (not illustrated) in which the gate drive circuit 1 is mounted.

When an off command is transmitted to the gate drive circuit 1, the gate drive current having been supplied from the gate-on drive unit 30 is stopped. Thereafter, the gate-off drive unit 31 outputs the first off-drive current set from the off-drive current switching unit 33 to start the off-drive of the power semiconductor element 20.

Figure 4:
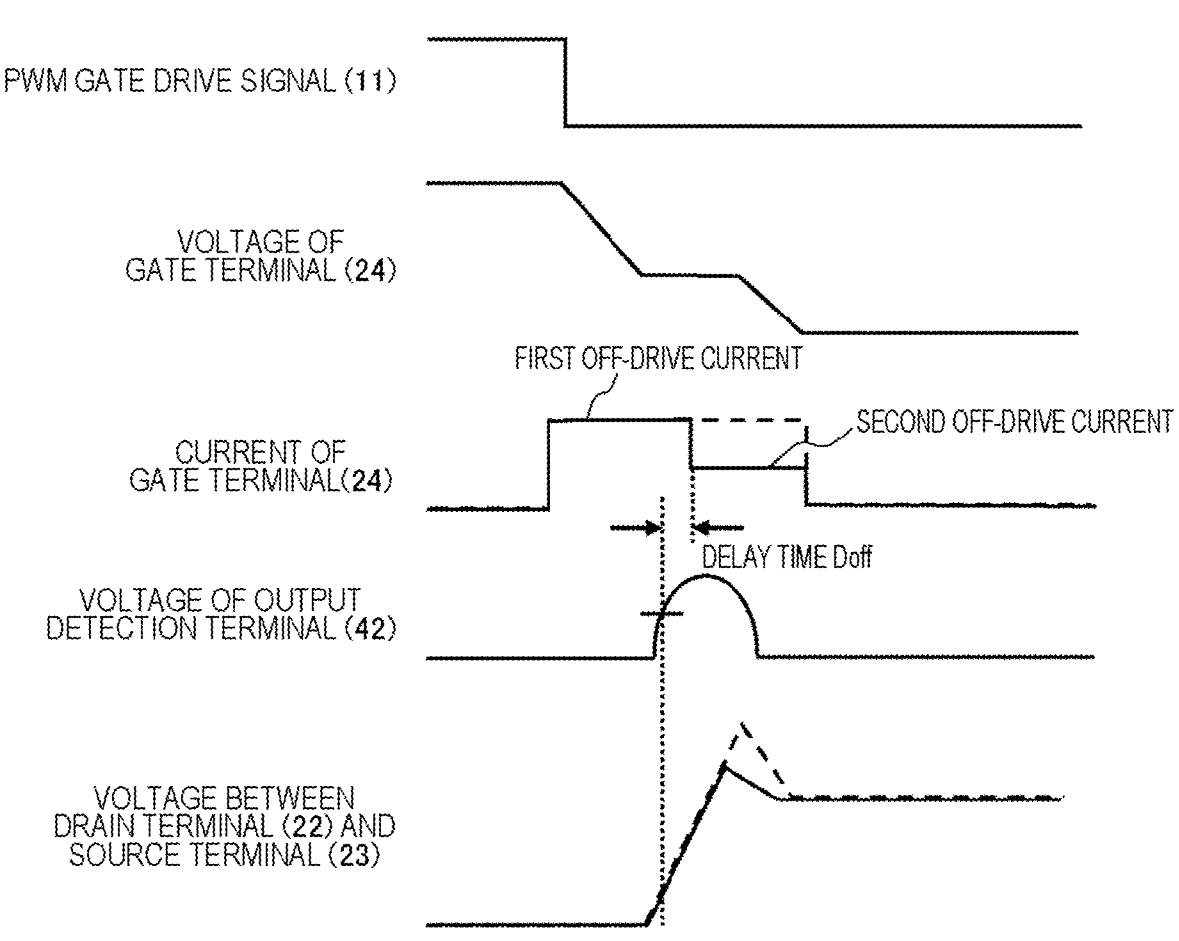
FIG. 4 is a timing chart at the time of an off operation of the power semiconductor element.

As illustrated in FIG. 4, the voltage of the gate terminal 24 gradually decreases due to the start of the off-drive, and becomes constant near the threshold value of the power semiconductor element 20. At this time, a voltage (hereinafter, referred to as "output voltage") between drain terminal 22 and source terminal 23, which is an output voltage, starts to increase, and switching in an off state is started.

The output transmission unit 40 connected to the drain terminal 22 detects the increase in the output voltage as a change in the AC voltage. The constant voltage generation unit 41 generates a constant DC voltage (for example, 5 V) and biases the output detection terminal 42. As illustrated in FIG. 4, due to the increase in the output voltage, the voltage of the output detection terminal 42 increases from, for example, 5 V of a constant voltage by AC detection of the increase in the output voltage.

The off-filter adjustment unit 43 functions to prevent erroneous detection due to noise of the output voltage and to perform delay time adjustment (delay circuit) until switching to the second off-drive current, and filters the voltage of the output detection terminal 42 and transmits the voltage to the output-off detection unit 45.

The output-off detection unit 45 performs a comparison operation on a reference voltage (for example, 6 V) higher than a constant voltage (for example, 5 V) of the voltage of the output detection terminal 42, and detects that off-switching has started when the voltage of the output detection terminal 42 exceeds 6 V.

Since the off-switching is detected only once for each off command of the PWM gate drive signal 11, the result of one detection is latched during the period of one PWM and cleared by a next PWM signal. With this operation, a plurality of detections during one switching can be avoided, and an erroneous switching operation of the gate drive current due to erroneous detection due to switching noise or the like can be prevented.

When the off-switching start is detected by the output-off detection unit 45, the off-switching start is transmitted to the off-drive current switching unit 33 by an off-detection signal 47, and in the off-drive current switching unit 33, the drive current is switched from the first off-drive current to the second off-drive current with a smaller current, and the power semiconductor element 20 is driven via the gate-off drive unit 31. That is, the gate drive current is decreased in the process of the switching in the off state and before reaching a peak voltage. By reducing the gate drive current to the second off-drive current during off-switching, an off-surge voltage can be reduced without changing the switching speed of the output voltage change.

Here, the off-surge voltage depends on a difference in the type and characteristics of the power semiconductor element 20, or various parameters such as a parasitic inductance and a parasitic capacitance of a bus bar or the like of a power module on which the power semiconductor element 20 is mounted. Therefore, the switching timing of the effective gate drive current reduction is often different for each electronic control unit.

In this regard, by the off-filter adjustment unit 43 adjusting a time from the change in the output voltage to the switching of the gate drive current, it is possible to adjust the optimum timing of the suppression of the off-surge voltage by the switching of the gate drive current.

Note that, although the off-filter adjustment unit 43 may be arranged at any position on a path from the drain terminal 22 to the gate-off drive unit 31, the off-filter adjustment unit is arranged at a preceding stage of the output-off detection unit 45 in the present embodiment since the off-filter adjustment unit has a filter function for eliminating erroneous detection due to noise in signal delay adjustment and output voltage change.

Next, the on operation of the power semiconductor element 20 by the gate drive circuit 1 of the present embodiment will be described with reference to FIGS. 1 and 5.

When on-drive is instructed by the PWM gate drive signal 11 from the microcontroller 10, a signal is transmitted by the inter-insulation communication unit 12 from a low-voltage unit (not illustrated) in which the microcontroller 10 is mounted to a high-voltage unit (not illustrated) in which the gate drive circuit 1 is mounted.

When an on command is transmitted to the gate drive circuit 1, first, the gate drive current having been supplied from the gate-off drive unit 31 is stopped. Next, the first on-drive current set from the on-drive current switching unit 32 is output, and the on-drive of the power semiconductor element 20 is started.

Figure 5:
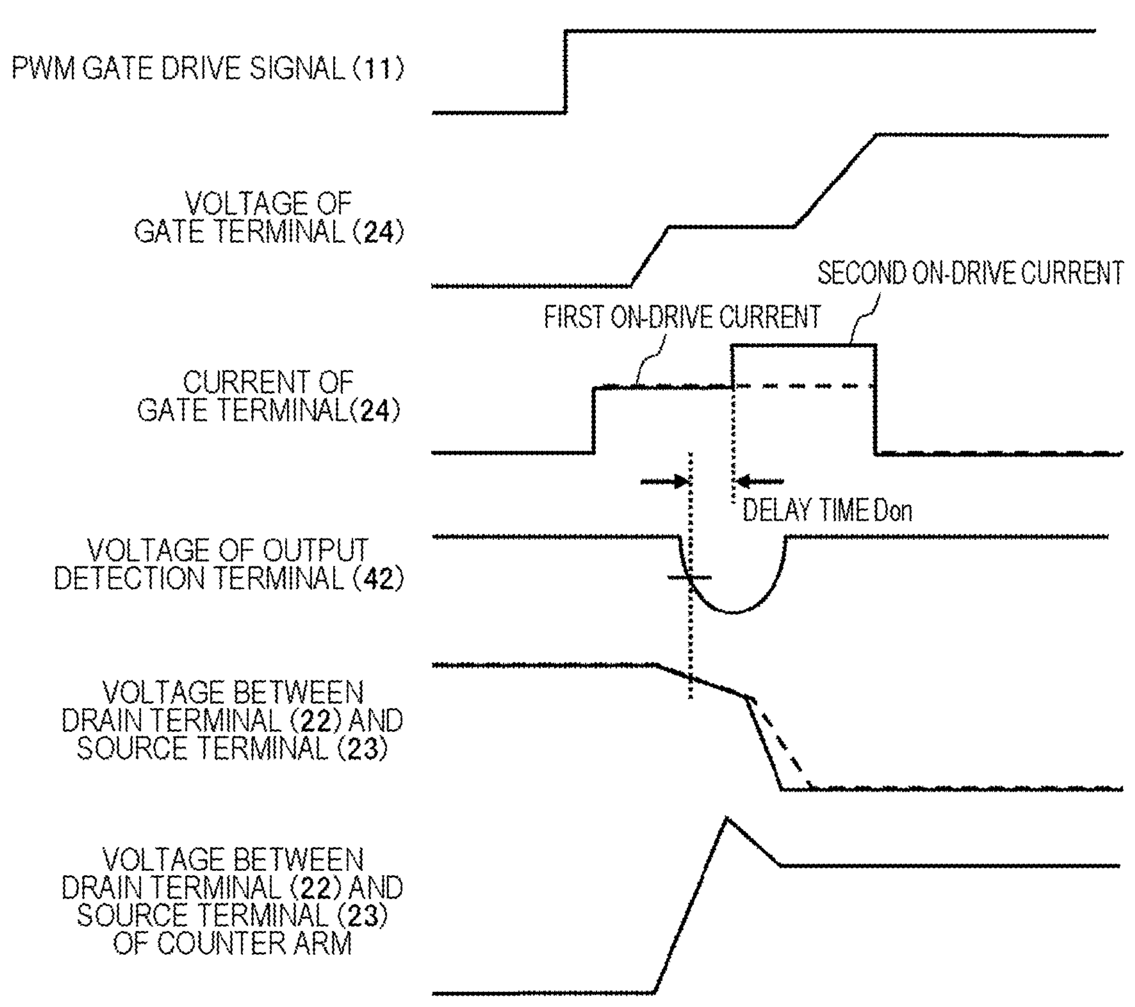
FIG. 5 is a timing chart at the time of an on operation of the power semiconductor element.

As illustrated in FIG. 5, the voltage of the gate terminal 24 gradually increases due to the start of the on-drive, and becomes constant near the threshold value of the power semiconductor element 20. At this time, the output voltage starts to decrease, and switching in the on state is started.

The output transmission unit 40 connected to the drain terminal 22 detects the decrease in the output voltage as a change in the AC voltage. As described above, the output transmission unit 40 can detect a change in the output voltage of both the on operation and the off operation of the power semiconductor element 20 in an AC manner.

Here, the gate drive circuit 1 that drives the power semiconductor element 20 operates at a voltage based on the voltage of the source terminal 23, but on the other hand, the voltage between the drain terminal 22 and the source terminal 22, which is the output voltage of the power semiconductor element 20, becomes a high voltage when the power semiconductor element 20 is off, and thus, a configuration with a high withstand voltage is required for the output transmission unit 40 connected to the drain terminal 22.

In this regard, in the present embodiment, a change in the output voltage of both the on operation and the off operation of the power semiconductor element 20 is transmitted as an AC signal to the output transmission unit 40 by using high withstand voltage capacitive coupling. By using the capacitive coupling, an increase and a decrease in the output voltage can be transmitted as an AC signal.

As illustrated in FIG. 5, during the on operation of the power semiconductor element 20, the output transmission unit 40 transmits a decrease in the output voltage as an AC signal. The constant voltage generation unit 41 generates a constant DC voltage (for example, 5 V) and biases the output detection terminal 42. The power semiconductor 20 starts the on operation, the output voltage starts to decrease, and the voltage of the output detection terminal 42 decreases from a constant voltage (for example, 5 V) by the output transmission unit 40.

The on-filter adjustment unit 44 functions to prevent erroneous detection due to noise of the output voltage and to perform delay time adjustment (delay circuit) until switching to the second on-drive current, and filters the voltage of the output detection terminal 42 and transmits the voltage to the output-on detection unit 46.

Here, if the switching delay adjustment time to the second off-drive current by the off-filter adjustment unit 43 and the switching delay adjustment time to the second on-drive current by the on-filter adjustment unit 44 are the same, the off-filter adjustment unit 43 and the on-filter adjustment unit 44 can be made common.

The output-on detection unit 46 performs a comparison operation on a reference voltage (for example, 4 V) lower than a constant voltage (for example, 5 V) of the voltage of the output detection terminal 42, and detects that on-switching has started when the voltage of the output detection terminal 42 falls below 4 V.

Since the on-switching is detected only once for each on command of the PWM gate drive signal 11, the result of one detection is latched during the period of one PWM and cleared by a next PWM signal. With this operation, a plurality of detections during one switching can be avoided, and an erroneous switching operation of the gate drive current due to erroneous detection due to switching noise or the like can be prevented.

When the on-switching start is detected by the output-on detection unit 46, the on-switching start it is transmitted to the on-drive current switching unit 32 by an on-detection signal 48, and in the on-drive current switching unit 32, the drive current is switched from the first on-drive current to the second on-drive current with a larger current, and the power semiconductor element 20 is driven via the gate-on drive unit 30. That is, the gate drive current is increased in the process of the switching in the on state and before reaching a peak voltage.

By increasing the gate drive current to the second on-drive current during the on-switching, the recovery surge of the output voltage of the counter arm illustrated in FIG. 5 does not change, the voltage of the gate terminal 24 is increased after the recovery surge ends, and the on-switching is performed at a high speed, so that the output voltage decreases at a high speed. Accordingly, it is possible to reduce switching loss.

Here, the recovery surge voltage of the counter arm is generated by the recovery operation of a reflux diode 21 generated when the current flowing in a forward direction to the reflux diode 21 of the power semiconductor element 20 of the counter arm is turned off, and depends on a difference in characteristics of the reflux diode 21, or various parameters such as parasitic inductance and parasitic capacitance of the bus bar or the like of the power module on which the power semiconductor element 20 and the reflux diode 21 are mounted. Therefore, the switching timing of the effective gate drive current reduction is often different for each electronic control unit.

In this regard, by the on-filter adjustment unit 44 adjusting a time from the change in the output voltage to the switching of the gate drive current, it is possible to adjust the optimum timing of the suppression of the recovery surge voltage of the counter arm by the switching of the gate drive current.

Note that, although the on-filter adjustment unit 44 may be arranged at any position on a path from the drain terminal 22 to the gate-on drive unit 30, the on-filter adjustment unit is arranged at a preceding stage of the output-on detection unit 46 in the present embodiment since the on-filter adjustment unit has a filter function for eliminating erroneous detection due to noise in signal delay adjustment and output voltage change.

In addition, the output-off detection unit 45 and the output-on detection unit 46 detect the start of the off-switching and the start of the on-switching, respectively, and do not need to detect the start of the off-switching and the start of the on-switching at the same time, and thus can be integrated into one. In this case, since the detection voltage is different between the on state and the off state, it is necessary to switch the detection voltage. Therefore, by integrating the gate drive circuit 1 of the present embodiment into one semiconductor integrated circuit, the area of the semiconductor chip can be reduced, which is effective in cost reduction.

As described above, in the electronic control unit of the present embodiment, the output transmission unit 40 connected to the drain terminal 22 of the power semiconductor element 20, the constant voltage generation unit 41, the output-off detection unit 45, the output-on detection unit 46, the off-filter adjustment unit 43, and the on-filter adjustment unit 44 can detect the change in the output voltage to detect the start of the on-switching or the start of the off-switching.

During the off operation, after the off-switching start detection, the off-drive current switching unit 33 switches and reduces the drive current from the first off-drive current to the second off-drive current, so that the off-surge voltage of the output voltage can be reduced. The off-surge voltage can be reduced, and thus as compared with a case where the present invention is not implemented, the first off-drive current can be increased, the off-switching of the power semiconductor element 20 can be speeded up, and the switching loss in the off-state can be reduced.

On the other hand, during the on operation, after the on-switching start detection, the on-drive current switching unit 32 can increase the gate drive current from the first on-drive current to the second on-drive current. Accordingly, when the gate drive current is increased after the recovery surge voltage generated in the recovery operation of the reflux diode 21 of the counter arm is generated, the switching of the output voltage can be speeded up without increasing the recovery surge voltage, and the on-switching loss can be reduced.

According to the present invention, it is possible to reduce the switching loss by detecting a change in the output voltage of the power semiconductor element 20 and switching and driving the gate drive current with an excellent timing.

In addition, since the junction temperature of the power semiconductor element is lowered by the loss reduction, the chip area of the power semiconductor element can be reduced, and the cost can be reduced.

Second Embodiment

An electronic control unit and a gate driving method of a power semiconductor element according to a second embodiment of the present invention will be described with reference to FIG. 2.

Figure 2:
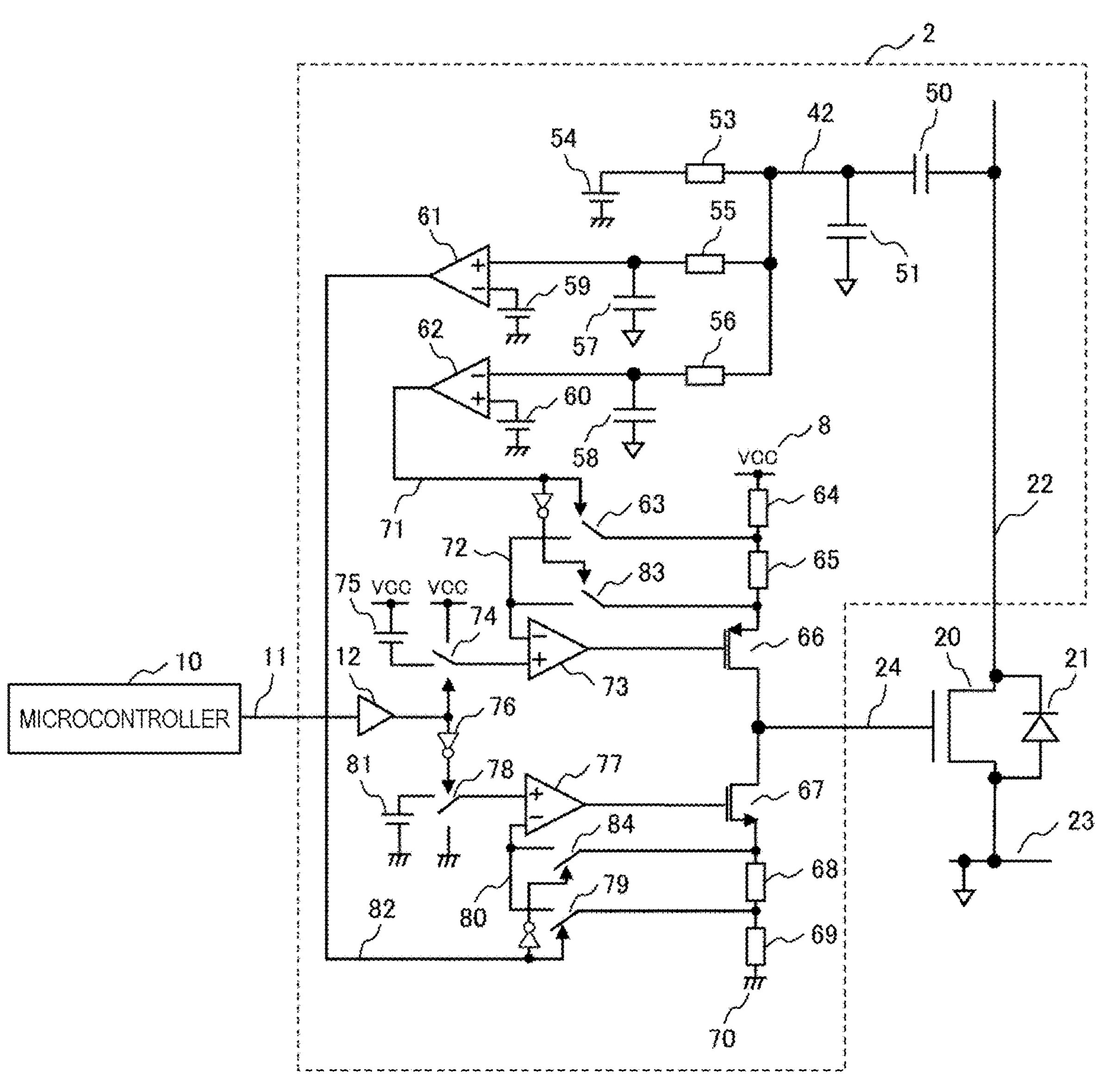
FIG. 2 is a diagram illustrating a schematic configuration of a gate drive circuit according to a second embodiment of the present invention.

FIG. 2 is a schematic configuration diagram of the electronic control unit of the present embodiment, and mainly illustrates a configuration of a gate drive circuit 2. The gate drive circuit 2 illustrated in FIG. 2 illustrates the configuration of the gate drive circuit 1 of FIG. 1 as a specific circuit example.

In general, there are two types of gate drive circuits: a constant current drive system in which a gate is driven with a constant current; and a constant voltage drive system in which a gate drive current is generated with a drive voltage and a resistor. The present embodiment is an embodiment in a case where the present invention is applied to the constant current drive system.

A command of the PWM gate drive signal 11 transmitted from the microcontroller 10 is transmitted by the inter-insulation communication unit 12 from a low-voltage unit (not illustrated) in which the microcontroller 10 is mounted to a high-voltage unit (not illustrated) in which the gate drive circuit 2 is mounted.

In a case where the PWM gate drive signal 11 is an off command, an on-control switch 74 switches an on-control reference voltage 75 to a power supply voltage VCC 8. Accordingly, an on-control amplifier 73 drives a PMOS FET 66 to control an on-control amplifier negative feedback terminal 72 from the on-control reference voltage 75 to the power supply voltage VCC 8 in a negative feedback operation. By this negative feedback operation, the gate drive current in the on state determined by the on-control amplifier negative feedback terminal 72 and resistors 64 and 65 becomes 0, and the gate drive current on an on side is turned off.

On the other hand, the inverter 76 controls an off-control switch 78 connected to the non-inverting input of an off-control amplifier 77, so that the non-inverting input of the off-control amplifier 77 is switched from a level of an off-reference voltage 70 to an off-control reference voltage 81. Accordingly, the off-control amplifier 77 drives an NMOS FET 67 to control an off-control amplifier negative feedback terminal 80 from the level of the off-reference voltage 70 to the same voltage as the off-control reference voltage 81 in the negative feedback operation. Since the gate drive current in the off-state is a constant current determined by the voltage of the off-control amplifier negative feedback terminal 80 and the resistors 68 and 69, the off-control amplifier negative feedback terminal 80 switches the level of the off-reference voltage 70 to the off-control reference voltage 81, so that the gate drive current in the off-state flows.

Here, at the start of the off operation, an off-current switching switch 79 is turned on, and an off-current switching switch 84 is turned off, and by the negative feedback control of the off-control amplifier 77, the first off-drive current illustrated in FIG. 4 becomes a current value obtained by dividing the on-control reference voltage 75 by the resistance value of the resistor 69.

When the on-side gate drive current and the off-side gate drive current flow at the same time, a current passing through from the power supply voltage VCC 8 to the off-reference voltage 70 flows. Therefore, when the on-side gate drive current and the off-side gate drive current are switched, both are temporarily turned off, and switching control is performed to prevent a through current from flowing.

Here, a constant voltage source 54 is a voltage source that outputs a constant voltage, and is assumed to output, for example, 5 V. In a case where the power semiconductor element 20 is not in the process of switching on or off, the voltage between the drain terminal 22 and the source terminal 23, which is the output voltage of the power semiconductor element 20, is a constant voltage, so that the voltage of the output detection terminal 42 is the same as that of the constant voltage source 54, and in this case, is 5 V.

As described in the first embodiment, the gate drive current in the off state flows at the timing illustrated in the timing chart of FIG. 4, whereby the power semiconductor element 20 starts the off operation, and the output voltage of the power semiconductor element 20 increases.

Here, a capacitance 50 is connected to the drain terminal 22, and increases the voltage of the output detection terminal 42 as the output voltage increases. The capacitance 51 has an effect of attenuating the transmission of the output voltage to the output detection terminal 42, and can suppress an excessive voltage change of the output detection terminal 42 when the output voltage has an amplitude of high voltage.

As illustrated in FIG. 4, the increase in the output voltage in the off state is transmitted to the output detection terminal 42, and a delay time Doff for switching the signal to the second off-drive current is adjusted by a resistor 55 and a capacitance 57. In addition, the resistor 55 and the capacitance 57 also serve as a filter for preventing erroneous detection of noise of the output voltage.

In a case where an input signal exceeds an off-detection reference voltage 59, an off-detection comparator 61 detects an increase in the output voltage, and switches the off-current switching switch 79 from the on state to the off state and the off-current switching switch 84 from the off state to the on state.

Accordingly, by the negative feedback control of the off-control amplifier 77, switching is performed to the second off-drive current obtained by dividing the off-control reference voltage 81 by the resistance values of the resistors 68 and 69.

As described above, the drive current is switched and reduced from the first off-drive current to the second off-drive current, so that the off-surge voltage of the output voltage can be reduced. The off-surge voltage can be reduced, and thus as compared with a case where the present invention is not implemented, the first off-drive current can be increased, the off-switching of the power semiconductor element 20 can be speeded up, and the switching loss in the off-state can be reduced.

On the other hand, in case where the PWM gate drive signal 11 is an on command, the off-control switch 78 is switched to the off-reference voltage 70 side, so that the gate drive current in the off state is stopped by the negative feedback operation of the off-control amplifier 77. In addition, the on-control switch 74 is switched from the power supply voltage VCC 8 to the on-control reference voltage 75, and the on-control amplifier negative feedback terminal 72 is controlled to the same voltage as the on-control reference voltage 75 by the negative feedback operation of the on-control amplifier 73, so that the gate drive current on the on side flows.

Here, at the start of the on operation, an on-current switching switch 63 is turned off, and the on-current switching switch 83 is turned on, and the first on-drive current illustrated in FIG. 5 becomes a current value obtained by dividing the on-control reference voltage 75 by the resistance values of the resistors 64 and 65.

When the gate driving in the on state is started, the power semiconductor element 20 starts the on operation, and the output voltage decreases. As illustrated in FIG. 5, the decrease in the output voltage is transmitted as the voltage decrease of the output detection terminal 42 via the capacitance 50. A delay time Don for switching the signal to the second on-drive current is adjusted by a resistor 56 and a capacitance 58. In addition, the resistor 56 and the capacitance 58 also serve as a filter for preventing erroneous detection of noise of the output voltage.

In a case where the input voltage falls below an on-detection reference voltage 60, an on-detection comparator 62 detects a decrease in the output voltage, and switches the on-current switching switch 63 from the off state to the on state and switches the on-current switching switch 83 from the on state to the off state. Accordingly, the gate drive current in the on-state is switched to the second on-drive current obtained by dividing the on-control reference voltage 75 by the resistance values of the resistors 64 and 65.

In the present embodiment, a method has been described which switches between the first on-drive current and the second on-drive current, and the first off-drive current and the second off-drive current by switching the negative feedback terminal of each of the on-control amplifier 73 and the off-control amplifier 77.

As another means, it is also possible to switch the drive current by switching each of the on-control reference voltage 75 and the off-control reference voltage 81, but the amplifier has a finite signal band and requires a time required for current switching. In a case where high-speed switching of the power semiconductor element 20 is not necessary, the configuration in which each of the on-control reference voltage 75 and the off-control reference voltage 81 is switched is simpler and more effective.

As described above, when the gate drive current is increased after the recovery surge voltage generated in the recovery operation of the reflux diode 21 of the counter arm is generated, the switching of the output voltage can be speeded up without increasing the recovery surge voltage, and the on-switching loss can be reduced.

Third Embodiment

An electronic control unit and a gate driving method of a power semiconductor element according to a third embodiment of the present invention will be described with reference to FIG. 3.

Figure 3:
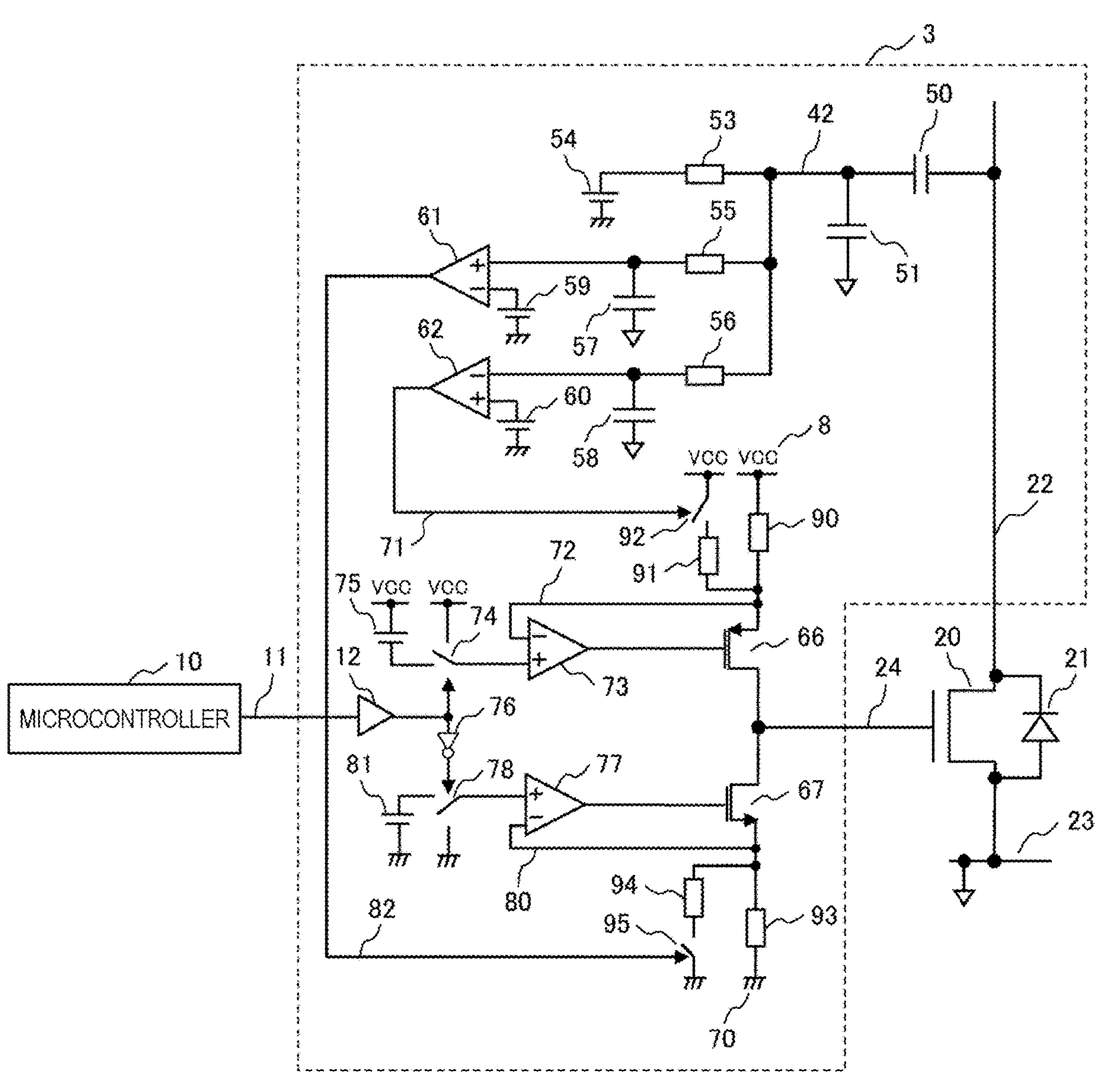
FIG. 3 is a diagram illustrating a schematic configuration of a gate drive circuit according to a third embodiment of the present invention.

FIG. 3 is a schematic configuration diagram of the electronic control unit of the present embodiment, and mainly illustrates a configuration of a gate drive circuit 3. The gate drive circuit 3 illustrated in FIG. 3 is a constant current drive system similarly to the second embodiment, and is different from the second embodiment in a method of switching between the first on-drive current and the second on-drive current, and the first off-drive current and the second off-drive current. Other configurations are similar to those of the second embodiment (FIG. 2).

As in the second embodiment, in the off state, the off-detection comparator 61 detects an increase in the output voltage of the power semiconductor element 20, and the off-current switching switch 95 is switched from the on state to the off state. Accordingly, the first off-drive current obtained by dividing the off-control reference voltage 81 by the resistance value of the parallel resistors of the resistors 93 and 94 can be switched to the second off-drive current obtained by dividing the off-control reference voltage 81 by the resistance value of the resistor 93.

On the other hand, similarly, in the on state, the on-detection comparator 62 detects a decrease in the output voltage of the power semiconductor element 20, and the on-current switching switch 92 is switched from the off state to the on state. Accordingly, the first on-drive current obtained by dividing the on-control reference voltage 75 by the resistance value of the resistor 90 can be switched to the second on-drive current obtained by dividing the on-control reference voltage 75 by the resistance value of the parallel resistors of the resistors 90 and 91.

In the present embodiment, unlike the switching of the negative feedback terminal of the amplifier as in the second embodiment, the loop of the negative feedback is not switched, and thus the stability of the amplifier is easily obtained.

Fourth Embodiment

An electronic control unit and a gate driving method of a power semiconductor element according to a fourth embodiment of the present invention will be described with reference to FIG. 6.

Figure 6:
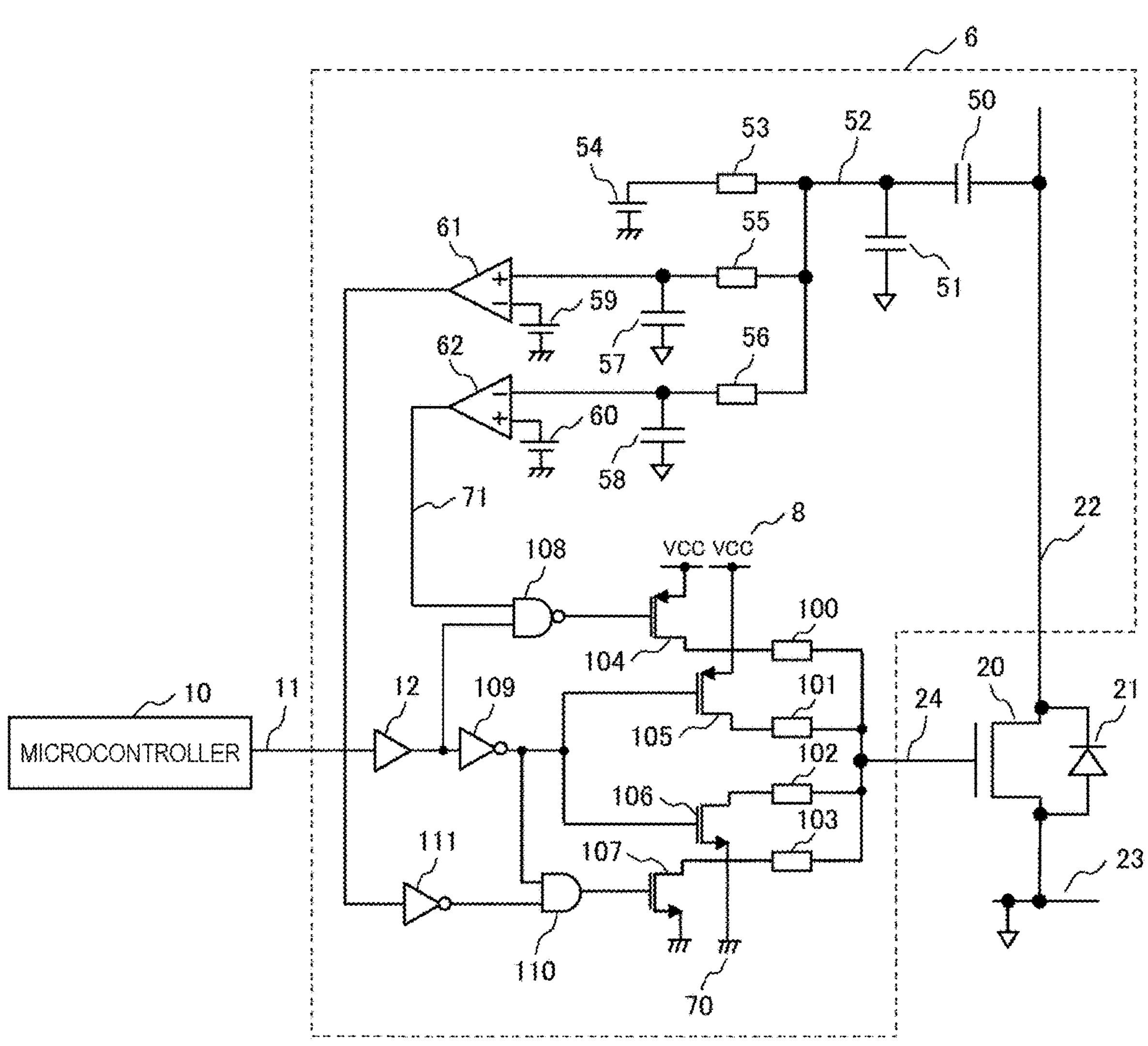
FIG. 6 is a diagram illustrating a schematic configuration of a gate drive circuit according to a fourth embodiment of the present invention.

FIG. 6 is a schematic configuration diagram of the electronic control unit of the present embodiment, and mainly illustrates a configuration of a gate drive circuit 6. The present embodiment is an embodiment in a case where the present invention is applied to the gate drive circuit of the constant voltage drive system.

In the constant voltage drive system, a PMOS FET 105 connected to the power supply voltage VCC 8 is turned on, so that the gate drive current in the on state flows due to a differential voltage and a resistor 101 between the power supply voltage VCC 8 and the gate terminal 24. Similarly, also in the gate drive current in the off state, an NMOS FET 106 is turned on, so that the gate drive current in the off state flows due to a differential voltage and a resistor 102 between the gate terminal 24 and the off-reference voltage 70. As described above, the gate can be driven with a simple configuration in which the MOS FET is connected to the gate terminal 24 via the resistor to be turned on and off, and thus the constant voltage drive system is generally widely used.

In the present embodiment, when the PWM gate drive signal 11 output from the microcontroller 10 is an off command, a signal is transmitted by the inter-insulation communication unit 12, passes through the inverter 109, and turns off the PMOS FET 105. In addition, a PMOS FET 104 is also turned off through a NAND 108. Accordingly, the gate drive current in the on state flowing through the PMOS FET 105 and the PMOS FET 104 is turned off.

Thereafter, the NMOS FET 106 connected to the inverter 109 is turned on, and the NMOS FET 107 is also turned on through an AND 110. Accordingly, the first off-drive current starts to flow, and the off operation of the power semiconductor element 20 is started.

The operation from the off operation of the power semiconductor element 20 to the off-detection comparator 61 is the same as the operation described in the second and third embodiments. When the increase in the output voltage of the power semiconductor element 20 is detected by the off-detection comparator 61, the off-drive current is decreased and switched to the second off-drive current by turning off the NMOS FET 107 through the inverters 111 and the AND 110.

As described above, similarly to the constant current drive system, even in the constant voltage drive system, the off-surge voltage of the output voltage can be reduced by reducing the gate drive current from the first off-drive current to the second off-drive current. Accordingly, as compared with a case where the present invention is not implemented, the first off-drive current can be increased, the off-switching of the power semiconductor element 20 can be speeded up, and the switching loss in the off-state can be reduced.

In a case where the PWM gate drive signal 11 is an on command, first, the NMOS FET 106 and the NMOS FET 107 are turned off. Next, the PMOS FET 105 is turned on, the first on-drive current determined by the differential voltage and the resistor 101 between the power supply voltage VCC 8 and the gate terminal 24 flows, and the power semiconductor element 20 starts the on operation.

The operation from the on operation of the power semiconductor element 20 to the on-detection comparator 62 is the same as the operation described in the second and third embodiments. When the on-detection comparator 62 detects a decrease in the output voltage of the power semiconductor element 20, in addition to the first on-drive current, the current from the PMOS FET 104 increases and the second on-drive current flows by turning on the PMOS FET 104 through the NAND 108. As described above, similarly to the constant current drive system, even in the constant voltage drive system, the switching loss in the on state can be reduced without increasing the recovery surge voltage of the counter arm, by increasing the gate drive current from the first on-drive current to the second on-drive current.

Fifth Embodiment

An electronic control unit according to a fifth embodiment of the present invention will be described with reference to FIG. 7.

Figure 7:
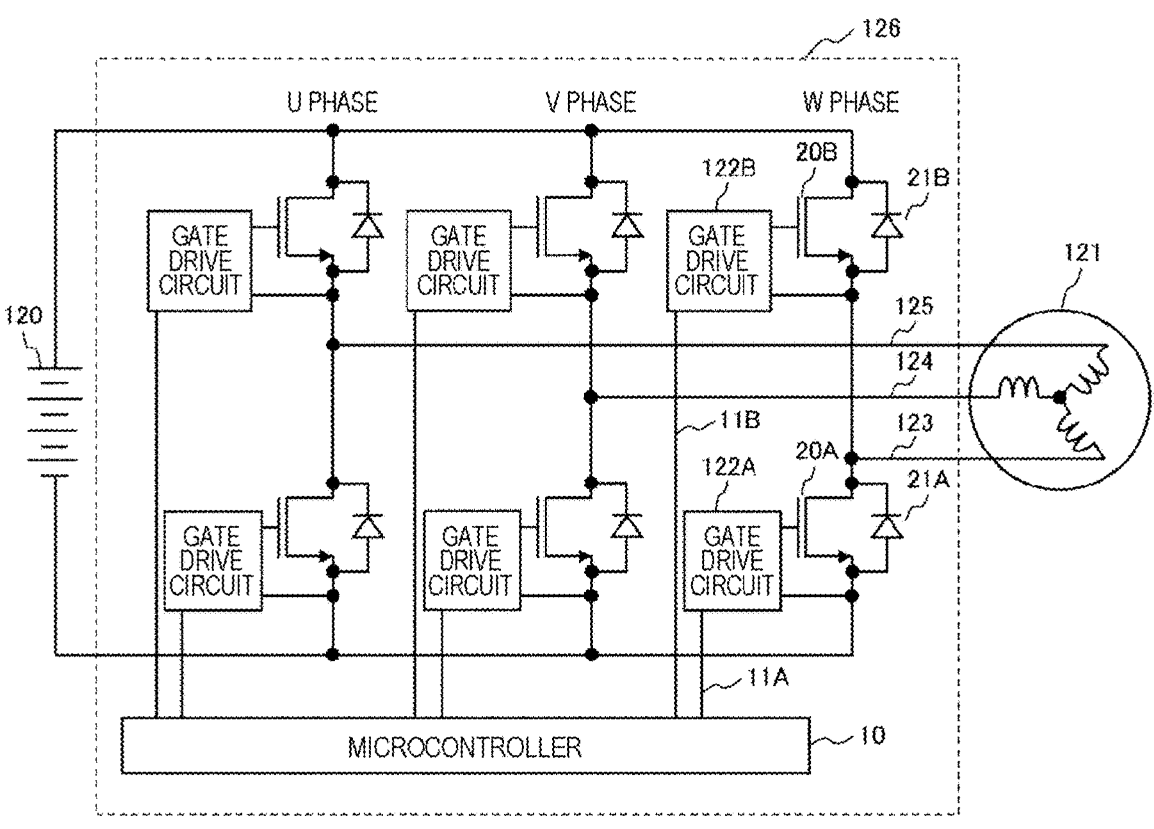
FIG. 7 is a diagram illustrating a schematic configuration of an electronic control unit according to a fifth embodiment of the present invention.

FIG. 7 is a diagram illustrating a schematic configuration of the electronic control unit of the present embodiment, and illustrates an example of an inverter on which the gate drive circuit described in any one of the first to fourth embodiments is mounted.

As illustrated in FIG. 7, the electronic control unit according to the present embodiment is an inverter 126 that converts DC power from a high-voltage battery 120 into three-phase AC power, supplies the three-phase AC power to a motor 121, and performs drive control.

When a W-phase is described as an example, a power semiconductor element 20B and a reflux diode 21B constituting the upper arm are connected in series to a power semiconductor element 20A and a reflux diode 21A constituting the lower arm, so as constitute a W-phase arm.

The power semiconductor element 20B and the power semiconductor element 20A are driven and controlled by gate drive currents generated by the gate drive circuits 122B and 122A, respectively. The gate drive circuit described in any one of the first to fourth embodiments is used for the gate drive circuits 122B and 122A.

The gate drive circuits 122B and 122A generate gate drive currents according to the on command and the off command of the PWM gate drive signals 11B and 11A from the microcontroller 10, respectively, and input the gate drive currents to the power semiconductor element 20B and the power semiconductor element 20A.

Also for a U phase and a V phase, arms are configured similarly to the W phase, and the inverter 126 is configured such that the respective arms of the U phase, the V phase, and the W phase are connected in parallel between the high-voltage battery 120 and the motor 121.

A U-phase output terminal 125, a V-phase output terminal 124, and a W-phase output terminal 123 are connected between the upper and lower arms of the U phase, the V phase, and the W phase, respectively, and are connected to the motor 121.

The inverter 126 of the present embodiment is configured as described above, and the switching loss of the power semiconductor element mounted inside can be reduced by the gate drive circuit of the present invention, which is effective in improvement of the conversion efficiency of the inverter and improvement of the maximum output power.

Note that the present invention is not limited to the above-described embodiments, and includes various modifications. For example, the above-described embodiments have been described in detail for easy understanding of the present invention, and are not necessarily limited to those having all the described configurations. In addition, a part of the configuration of a certain embodiment can be replaced with the configuration of another embodiment, and the configuration of another embodiment can be added to the configuration of a certain embodiment. In addition, it is possible to add, delete, and replace other configurations for a part of the configuration of each embodiment.

REFERENCE SIGNS LIST

1, 2, 3, 6, 122A, 122B gate drive circuit
8 power supply voltage VCC
10 microcontroller
11, 11A, 11B PWM gate drive signal
12 inter-insulation communication unit
20, 20A, 20B power semiconductor element
21, 21A, 21B reflux diode
22 drain terminal
23 source terminal
24 gate terminal
30 gate-on drive unit
31 gate-off drive unit
32 on-drive current switching unit
33 off-drive current switching unit
40 output transmission unit
41 constant voltage generation unit
42 output detection terminal
43 off-filter adjustment unit
44 on-filter adjustment unit
45 output-off detection unit
46 output-on detection unit
47, 82 off-detection signal
48, 71 on-detection signal
50, 51, 57, 58 capacitance
53, 55, 56 resistor
54 constant voltage source
59 off-detection reference voltage
60 on-detection reference voltage
61 off-detection comparator
62 on-detection comparator
63, 83, 92 on-current switching switch
64, 65, 68, 69, 90, 91, 93, 94, 100, 101, 102, 103 resistor
66, 104, 105 PMOS FET
67, 106, 107 NMOS FET
70 off-reference voltage
72 on-control amplifier negative feedback terminal
73 on-control amplifier
74 on-control switch
75 on-control reference voltage
76, 109, 111 inverter
77 off-control amplifier
78 off-control switch
79, 84, 95 off-current switching switch
80 off-control amplifier negative feedback terminal
81 off-control reference voltage
108 NAND
110 AND
120 high-voltage battery
121 motor
123 W-phase output terminal
124 V-phase output terminal
125 U-phase output terminal
126 inverter

The invention claimed is:

1. An electronic control unit comprising:
a microcontroller;
a power semiconductor element; and
a gate drive circuit that generates a gate drive current of the power semiconductor element on a basis of a command from the microcontroller,
wherein the gate drive circuit:
detects a change in an output voltage of the power semiconductor element to detect start of an on/off operation of switching,
increases a gate drive current in a process of the switching in an on state and before reaching a peak voltage,
decreases the gate drive current in a process of the switching in an off state and before reaching the peak voltage;
detects start of an on operation of the switching only once in response to an on command from the microcontroller, and latches a result of the detection until a next off command, and
detects start of an off operation of the switching only once in response to an off command from the microcontroller and latches a result of the detection until a next on command.

2. A gate driving method of a power semiconductor element, comprising:
detecting a change in a voltage between a drain terminal and a source terminal of a power semiconductor element to detect start of an on/off operation of switching;
increasing a gate drive current in a process of the switching when the power semiconductor element is in an on state and before reaching a peak voltage;
decreasing the gate drive current in a process of the switching when the power semiconductor element is in an off state and before reaching the peak voltage;
detecting start of an on operation of the switching only once in response to an on command from a microcontroller, and latching a result of the detection until a next off command; and
detecting start of an off operation of the switching only once in response to an off command from the microcontroller and latching a result of the detection until a next on command.

* * * * *